United States Patent [19]

Knight et al.

[11] 3,722,299

[45] Mar. 27, 1973

[54] CAM ACTION TUNING SLIDES

[75] Inventors: Theodore L. Knight, Newport News; Raymen F. Emery, Yorktown, both of Va.

[73] Assignee: The Bendix Corporation, Newport News, Va.

[22] Filed: Aug. 18, 1971

[21] Appl. No.: 172,696

[52] U.S. Cl. ....................................... 74/10.33, 334/7

[51] Int. Cl. ............................................... F16h 35/18

[58] Field of Search....74/10.33, 10.31, 10.29, 10.27; 334/7

[56] References Cited

UNITED STATES PATENTS

| | | | |
|---|---|---|---|
| 3,403,564 | 10/1968 | Ohashi | 74/10.33 |
| 3,545,288 | 12/1970 | Ohashi | 74/10.33 |
| 3,545,289 | 12/1970 | Ohashi | 74/10.33 |

*Primary Examiner*—Milton Kaufman
*Attorney*—Bruce L. Lamb et al.

[57] ABSTRACT

A five by ten pushbutton radio receiver tuner includes five pushbutton slides with two tuning slides alternately actuated by each pushbutton slide. An engagement pin carried by a pushbutton slide engages a ramp slot on one or the other of the tuning slides associated with that pushbutton slide to actuate the tuning slide when the pushbutton slide is actuated. Simultaneously, the engagement pin operates against the ramp slot forcing the tuning slide against a vertical stop to thus remove vertical play from the tuning slide.

3 Claims, 4 Drawing Figures

PATENTED MAR 27 1973

3,722,299

INVENTORS
THEODORE L. KNIGHT
RAYMEN F. EMERY
BY
William G. Christoforo
ATTORNEY

CAM ACTION TUNING SLIDES

BACKGROUND OF THE INVENTION

This invention relates to pushbutton tuners for radio receivers and more particularly to those radio receiver tuners whose pushbuttons selectively actuate one out of a plurality of tuning slides and where additionally the tuner has been reduced in size considerably over earlier tuners.

The development of the pushbutton tuner in the automotive radio field has met with almost unqualified approval due to the ease with which the individual pushbuttons can be set up, the ease and speed with which the radio receiver can be tuned to the various stations set up on the pushbuttons, and the safety inherent in being able to locate familiar stations without having to search through the broadcast band. When the tuner is used in a radio receiver covering a single broadcast band, such as the AM broadcast band, a different AM station can be set up on each pushbutton allowing as many stations to be selected by pushbuttons as there are pushbuttons provided on the tuner. This type of tuner is a so-called five by five tuner, that is, five pushbuttons are provided with each pushbutton being actuable to set up a single station.

A so-called five by ten pushbutton radio receiver tuner has become known and used in dual broadcast band radio receivers, such as AM/FM receivers. This tuner is provided with a bandswitch which may be operated either manually or through a cam follower. This latter type of pushbutton tuner is characterized by pushbuttons, each of which may selectively actuate one of two tuning slides, thus permitting the tuner to be used to set up and select ten individual stations at the option of the operator. Briefly, this is accomplished by providing two tuning slides for each pushbutton slide, with one tuning slide being located on either side of the pushbutton slide. A pin or tab on the pushbutton or pushbutton slide is operable to engage a slot or other abutting surface on one or the other of the tuning slides. With the pushbutton slide engaged to one of the tuning slides, the operation of that pushbutton is identical to the operation of a pushbutton on a five by five tuner. That is, the locking mechanism on a tuning slide which normally clamps a cam segment in the set position is unlocked by exerting an outward force on a pushbutton which unlocks the segment. When the pushbutton is depressed, the segment is forced against the preset position of a tilt bar structure forcing the segment to conform to the position of the tilt bar structure and further pressure on the pushbutton locks the segment in the now properly set position. Thereafter, when the pushbutton slide is depressed, the locked segment of the tuning slide will force the tilt bar structure to conform with the position of the segment.

A number of different means by which a pushbutton slide engages one or the other of its tuning slides are known. These means include rocker arms or pins carried by the pushbutton or pushbutton slide and moved or rocked sideways by actuation of the bandswitch mechanism to engage one or the other of the tuning slides. Turnover pushbuttons are also known which include a tab on one of the pushbutton slides which engages one or the other of the tuning slides when the pushbutton is turned over. This type of pushbutton also normally includes cam structures on the top and bottom of the pushbutton which automatically actuate the bandswitch when the pushbutton is depressed.

In earlier known pushbutton tuners, the tuning slides have reciprocated within fixed guide ways. The size of the tuner permitted the guide ways to be separated at such a distance along the length of the tuning slide so that with normal commercial tolerances the vertical play, which introduces rotational play at the tuning slide cam, was insignificant. This type of play, as should be readily known by one skilled in the art, affects the angular position to which the tilt bar structure will be set when the pushbutton is depressed; it will thus affect the tuning repeatability of the tuning slide.

It is now desired to reduce the size of known pushbutton tuners, and particularly to compress drastically the front to back length of the present mechanism. In so doing, the fixed guide ways within which the tuning slides reciprocate are necessarily drawn towards one another so that the commercial manufacturing tolerances which will be involved magnify the possible rotational play of the cam with resultant dilatorious affect upon the tuning accuracy of tuning slide.

SUMMARY OF THE INVENTION

It is thus an object of this invention to provide a pushbutton tuner for radio receivers which are built in accordance with the proven principles of the known art but which permit a drastic reduction in size without producing unacceptable tuning errors.

It is another object of this invention to provide a pushbutton tuner of considerably reduced size over earlier tuners and manufactured within commercial tolerance without increasing the tuning errors.

A still further object of the invention is to provide a five by ten pushbutton tuner for radio receivers reduced in size from previous tuners and having commercially acceptable tuning errors.

These and other objects of the invention are accomplished by providing tuning slides on each side of a pushbutton, with one or the other of the tuning slides being selectively actuated by engagement means mounted and carried by the pushbutton or pushbutton slide, the engagement means engaging and abutting the tuning slide at a ramped opposed surface to thereby force the tuning slide in a vertical direction against a fixed reference at the outboard tuning slide guide way thereby taking up the vertical clearance of the tuning slide while at the same time forcing the tuning slide in a normal direction to effect tuning.

DESCRIPTION OF THE PREFERRED EMBODIMENT

Figure 1:
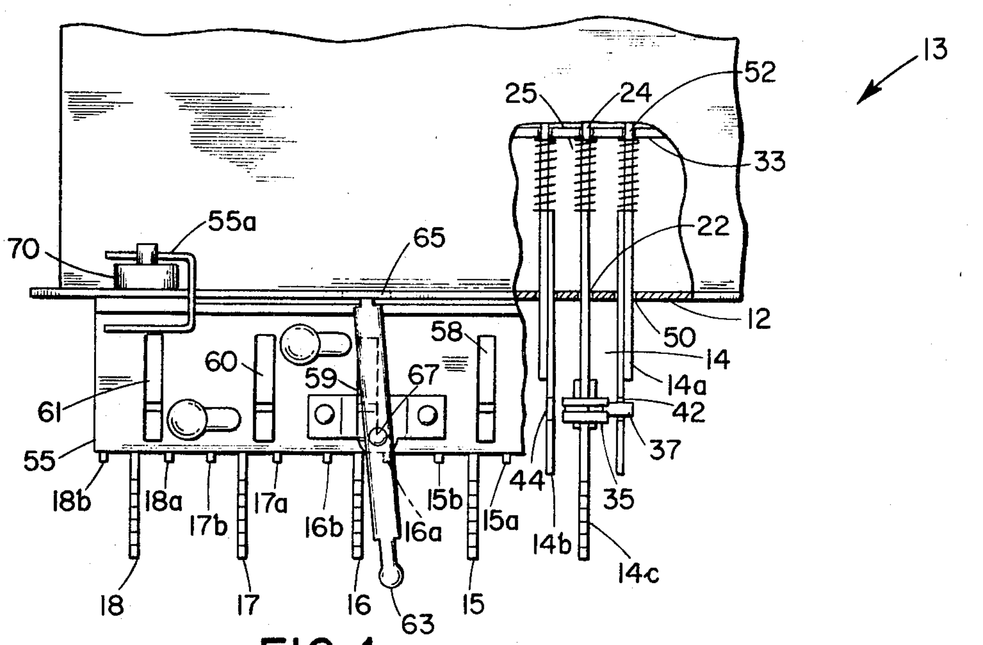
FIG. 1 is a plan view of a tuner constructed in accordance with this invention.

FIG. 1 shows a plan view of a tuner constructed in accordance with this invention and includes pushbutton slides 14 to 18. A pushbutton (not shown) is normally fastened on the end of each pushbutton slide, for example, at end 14*c*, as well known to those skilled in the art. A tuning mechanism 13 is actuated by one of tuning slides 14*a*, 14*b*, 15*a*, 15*b*, 16*a*, 16*b*, 17*a*, 17*b*, 18*a* or 18*b* as chosen by depressing the proper pushbutton slide when that slide engages the proper tuning slide as will be fully explained below. The details of the tuning mechanism 13 have been omitted for clarity and brevity. Tuning mechanisms of the type contemplated for use with this invention are well known in the art and have previously been discussed. Briefly, they include a resettable articulated cam segment mounted on each tuning slide which abuts and positions a rotatable tilt bar structure when the tuning slide is depressed. The tilt bar structure linearly positions a slidable carriage carrying a plurality of tuning slugs or other tuning means so as to position the tuning means to effect tuning of the radio. In the present embodiment of the invention, certain of these tuning means would be predesigned for AM operation and others for FM operation. Tuning mechanisms of this type have been taught by the patent to H. J. McDarby, U.S. Pat. No. 2,267,474 issued Dec. 23, 1941, with improvements to the aforementioned resettable cam segment mounted on the tuning slide as taught by the U.S. Pat. to E. H. Allen, No. 2,659,236, issued Nov. 17, 1953.

Figure 2:
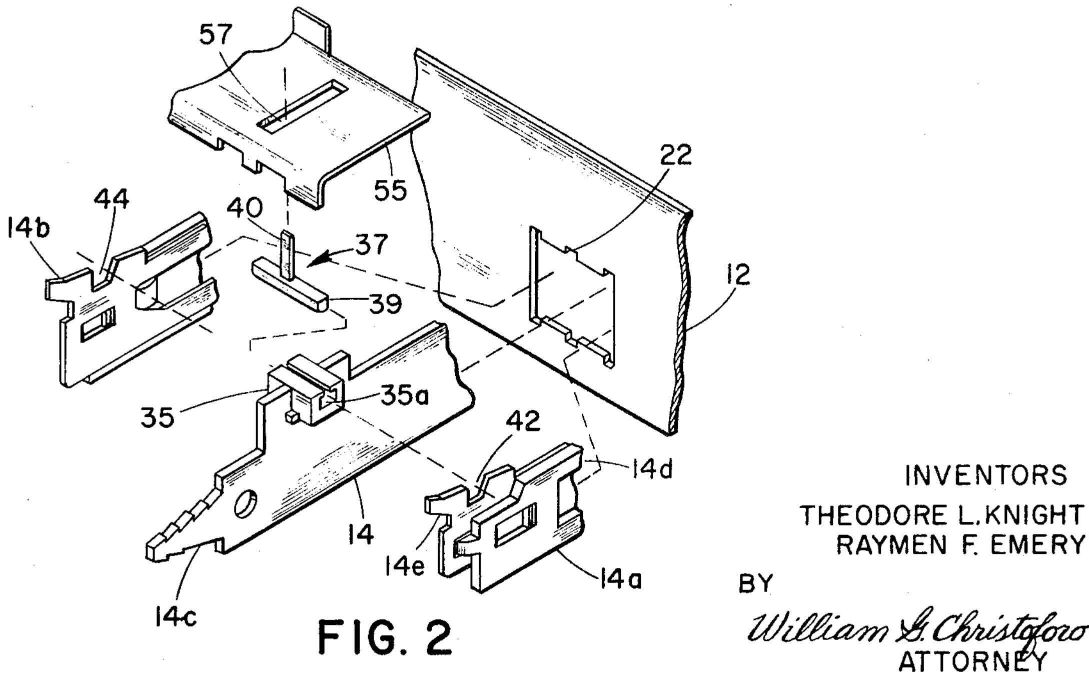
FIG. 2 is an exploded isometric view showing the cooperation of the pushbutton and dual slides.

It will be particularly noted that in the various figures each tuning slide is represented by two separate pieces, for example, in FIG. 2 pieces 14*d* and 14*e*. This representation shows the prior art tuning slide taught in the above mentioned publications. It is only necessary for an understanding of this invention to know that these separate pieces are rigidly joined to one another during the tuning of the radio and hence move as a single element. During setting and resetting of an individual tuning slide to a different station, that is, when the pushbutton in withdrawn toward the operator, these pieces will separate, as well known to those skilled in the art.

It will also be noted that the tuner illustrated in the various drawings includes five pushbutton slides. The exact number of pushbutton slides which can be used with this invention is, of course, arbitrary and any discussion of the structure for operation of one pushbutton slide and its related cooperating parts is relevant to all pushbutton slides.

Pushbutton slide 14 is free to move linearly toward tuner mechanism 13 in slots 22 and 24 located in panels 12 and 33, respectively, when urged rearward by a force applied on pushbutton slide end 14*c*. A spring 25 opposes this depressing force and restores slide 14 to its normal position (as shown) when the depressing force is removed. A pin guide 35 includes a pin slot 35*a* (FIG. 2) having a longitudinal axis perpendicular to the direction of travel of pushbutton slide 14 as depressed towards tuning mechanism 13. FIG. 2 shows pin guide 35 in greater detail, so that reference to this latter figure should now also be made. A T-shaped pin 37 has lateral arms 39 which are slidably contained within slot 35*a*. T-pin 37 also includes an upstanding pin section 40, the purpose of which will be explained shortly.

Tuning slides 14*a* and 14*b* include, respectively, open slots 42 and 44. It will be made obvious that these slots can optionally be closed. These slots are so positioned that when the tuner is in its normal condition, that is with no pushbutton slides depressed, the slots lay on the longitudinal axis of slot 35*a* so that T-pin 37 can be selectively positioned to the right or the left, with respect to pushbutton slide 14, so as to engage either slot 42 or slot 44, respectively. With one of the other of the tuning slides thus engaged, for example, with tuning slide 14*a* engaged as seen in FIG. 1 the other tuning slide, 14*b*, will be disengaged. Depression of pushbutton slide 14 will move that slide towards tuning mechanism 13. Carried with the pushbutton slide will be pin guide 35 and T-pin 37. As mentioned, the T-pin is now engaged in slot 42 so that tuning slide 14*a* is also moved towards tuning mechanism 13 thereby tuning the radio associated therewith to the station preset by tuning slide 14*a*, in the manner well known to those skilled in the art.

Figure 4:
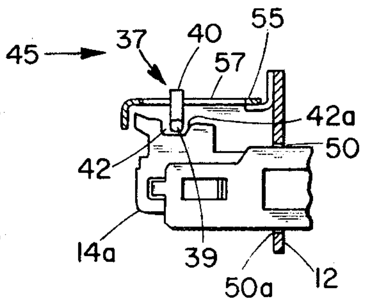
FIG. 4 shows in greater detail the operation of the invention.

Referring now to FIG. 4, T-pin 37 is seen engaging slot 42 of tuning slide 14*a*. In this figure, arrow 45 indicates the direction of movement of tuning slide 14*a* when its associated pushbutton slide 14 is depressed to effect tuning of the radio. It will be noted that slot 42 includes the canted side 42*a* against which T-pin end 39 bears while forcing slide 14*a* in the direction of arrow 45. The force exerted by T-pin end 39 against canted slide 42*a* not only forces slide 14*a* in the direction of arrow 45 but also forces the slide downward so that the bottom edge is forced against the bottom edge 50*a* of tuning slide slot 50. Bottom edge 50*a* together with the bottom edge of slide 14*a* constitute a reference point with respect to the tuning mechanism thereby effectively compensating for the aforementioned objectionable production tolerances and thus insuring the repeatability of the tuning operation.

It is preferable that the contact point of T-pin end 39 with canted sides 42*a* be rounded so that slide 14*a* may move downward unimpeded against slot end 50*a* when so urged by T-pin 37.

Figure 3:
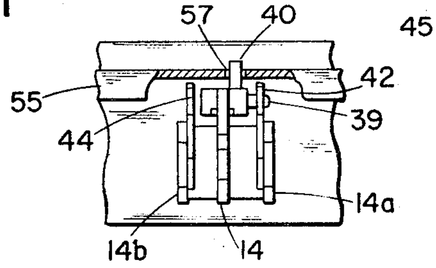
FIG. 3 is a front view of the invention.

As T-pin 37 moves in the direction of arrow 45 to effect the aforementioned motion of tuning slide 14*a* it is, of course, carried by pushbutton slide 14 and thereon fastened pin guide 35. In addition, in its movement in the direction of arrow 45, end 40 of T-pin 37 is constrained within slot 57 of band selector 55. As seen more clearly in FIGS. 2 and 3 slot 57 has its longitudinal axis disposed along the line of movement of pushbutton slide 14 to bias T-pin 37 either to the right or to the left (as seen in FIGS. 1, 2 and 3) to engage either slot 42 or 44. This is more clearly seen in FIG. 3, reference to which in particular should now be made. Seen in this figure is pin end 40 engaged in slot 57 of band selector 55. Band selector 55 is biased to the right of pushbutton slide 14 thereby carrying pin end 39 into engagement with slot 42 of tuning slide 14*a*. It should now be obvious that should band selector 55 be moved to the left so that slot 57 now carries pin end 40 to the left of pushbutton slide 14, pin end 39 will engage slot 44 of tuning slide 14*b* so that pushbutton slide 14 being depressed tuning slide 14*b* will be actuated to effect tuning of the radio to the station preset upon that tuning slide. The operation of the band selector 55 is more clearly shown in FIG. 1, reference to which should now again be made. A selector lever 63 is pivotedly connected to band selector 55 at pivot point 67. In addition, the rear end of selector level 63 is protruded into and captivated by slot 64 in end plate 12. Band selector 55 includes in addition to slot 57, which is not shown here since it is cut away, slots 58, 59, 60 and 61 which are associated with the T-pins carried by tuning slides 15, 16, 17 and 18, respectively. With the position of band selector 55 as shown all T-pins are positioned to the right of their associated pushbutton slides to thus engage tuning slides 14*a*, 15*a*, 16*a*, 17*a* and 18*a*, respectively. A U-shaped bracket 55*a* carried by band selector 55 engages band selector switch 70. With the band selector in the position shown, switch 70 is in a first position which may correspond, for example, to FM operation of the radio. When selector level 63 is moved to the left thus carrying band selector 55 to the left, and of course also carrying each T-pin to the left to thus engage tuning slides 14*b*, 15*b*, 16*b*, 17*b*, and 18*b*, switch 70 is also thrown to its second position which, for example, can be the AM position on the radio.

As earlier mentioned, other five by ten pushbutton tuners are known, for example, those tuners using rocker arms or turnover pushbuttons to provide selectable engagement between the pushbutton slide and the tuning slides. From the above teachings it should be obvious to one skilled in the art that this invention can be adapted to these other tuners by simply providing a slanting engagement between the pushbutton slide and the engaged tuning slide so that forces transmitted from the pushbutton slide to the tuning slide are not only in the direction of usual tuning slide movement but also in a direction perpendicular thereto.

The invention claimed is:

1. In a pushbutton tuner including a tuning means and plurality of pushbutton means having multiple operational modes, an improvement comprising:

a plurality of tuning means actuators associated with each said pushbutton means, one said actuator for each said operational mode, each said actuator being arranged for reciprocating movement along a predetermined line of motion; and, means disposed on each said pushbutton means for selectively cooperating with one or another of its associated tuning means actuators and for applying a force having components in a direction along said line of motion and in direction transverse to said line of motion to the cooperating tuning means actuator.

2. A pushbutton tuner as recited in claim 1, one operational mode being AM and the other operational mode being FM, and having additionally:

switching means for selecting said receiver mode; and means for actuating said switching means and simultaneously actuating said cooperating means.

3. A pushbutton tuner as recited in claim 2 wherein each said pushbutton means has two associated tuning means actuators.

* * * * *